United States Patent
Hong et al.

(10) Patent No.: US 8,097,513 B2
(45) Date of Patent: Jan. 17, 2012

(54) VERTICAL TRANSISTOR OF SEMICONDUCTOR DEVICE AND METHOD OF FORMING THE SAME

(75) Inventors: Ki Ro Hong, Seoul (KR); Do Hyung Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 253 days.

(21) Appl. No.: 12/341,583

(22) Filed: Dec. 22, 2008

(65) Prior Publication Data

US 2009/0242979 A1 Oct. 1, 2009

(30) Foreign Application Priority Data

Mar. 27, 2008 (KR) .................. 10-2008-0028395

(51) Int. Cl.
*H01L 21/336* (2006.01)

(52) U.S. Cl. ........ 438/270; 438/212; 438/268; 438/300; 257/401; 257/E21.619; 257/E21.621; 257/E21.634; 257/E21.635

(58) Field of Classification Search .................. 438/212, 438/268, 269, 270, 300; 257/401, E21.619, 257/E21.634, E21.635
See application file for complete search history.

(56) References Cited

U.S. PATENT DOCUMENTS

| 5,225,701 A * | 7/1993 | Shimizu et al. ............... 257/347 |
| 6,387,758 B1 * | 5/2002 | Yu et al. ......................... 438/269 |
| 6,406,962 B1 * | 6/2002 | Agnello et al. ............... 438/268 |
| 6,642,115 B1 * | 11/2003 | Cohen et al. ................. 438/283 |
| 7,217,974 B2 | 5/2007 | Forbes et al. ................. 257/327 |
| 7,531,412 B2 * | 5/2009 | Yoon et al. .................... 438/270 |
| 2004/0150028 A1 * | 8/2004 | Horiguchi ..................... 257/306 |
| 2006/0046392 A1 * | 3/2006 | Manning et al. .............. 438/268 |
| 2007/0075359 A1 * | 4/2007 | Yoon et al. .................... 257/329 |

FOREIGN PATENT DOCUMENTS

JP        08-330586      12/1996
KR     10-2003-0058633    7/2003

* cited by examiner

*Primary Examiner* — Julio J Maldonado
(74) *Attorney, Agent, or Firm* — Marshall, Gerstein & Borun LLP

(57) ABSTRACT

A vertical transistor of a semiconductor device has a channel area formed in a vertical direction to a semiconductor substrate. After semiconductor poles corresponding to the length of semiconductor channels and gate electrodes surrounding sidewalls of the semiconductor poles are formed, subsequent processes of forming silicon patterns corresponding to junction areas, etc. are performed. The gate electrodes support the semiconductor poles during these subsequent processes. The height of the semiconductor poles corresponding to the length of the channel is increased, yet the semiconductor poles do not collapse or incline since the gate electrodes support the semiconductor poles.

6 Claims, 5 Drawing Sheets

VERTICAL TRANSISTOR OF SEMICONDUCTOR DEVICE AND METHOD OF FORMING THE SAME

CROSS-REFERENCES TO RELATED APPLICATIONS

The present application claims priority to Korean patent application number 10-2008-0028395, filed on Mar. 27, 2008, which is incorporated by reference in its entirety.

BACKGROUND OF THE INVENTION

The present invention relates to a vertical transistor of a semiconductor device and a method of forming the same and, more particularly, to a vertical transistor of a semiconductor device, which has channel areas formed in a vertical direction to a semiconductor substrate, and a method of forming the same.

Semiconductor devices have been developed in various forms in order to facilitate high integration. As part of such efforts, a vertical transistor has been proposed.

FIG. 1 shows conventional semiconductor poles. As seen in FIG. 1, each of semiconductor poles 12 includes an upper portion 12a having a first width W1 and a lower portion 12b having a second width W2 narrower than the first width W1. The semiconductor poles 12 are isolated by a trench 14 formed in the semiconductor substrate 10. The lower portion 12b of the semiconductor pole 12 corresponds to a channel area, and the height of the lower portion 12b corresponds to a channel length. In order to prevent a short channel effect in the transistor, it is preferred that the lower portion 12b of the semiconductor pole be high. However, if the lower portion 12b of the semiconductor pole is high, the lower portion 12b of the semiconductor pole cannot withstand the load of the upper portion 12a and the load applied thereto when subsequent processes are performed. Consequently, a problem arises because the semiconductor poles 12 collapse or are inclined as in a region 'A' shown in FIG. 2.

Further, since a top width of the trench 14 is narrower than a lower width thereof, the trench 14 is not fully gap-filled with a conductive layer when the trench 14 is gap-filled with the conductive layer in order to form a gate electrode. Accordingly, a seam may occur at the bottom of the trench 14. The semiconductor substrate 10 corresponding to a portion where the seam is generated is exposed to etch materials and likely to be damaged, when an etch process for forming the gate electrode is performed.

BRIEF SUMMARY OF THE INVENTION

The present invention is directed towards a vertical transistor of a semiconductor device and a method of forming the same, which provides and increased semiconductor pole height and corresponding increased channel length. At the same time, it can prevent the semiconductor pole from being inclined or collapsing and corresponding damage to the semiconductor substrate.

A vertical transistor of a semiconductor device according to the present invention may include semiconductor poles, each protruding between trenches formed in a semiconductor substrate, a gate insulating layer formed on circumferences of the semiconductor poles, gate electrodes formed on circumferences of the gate insulating layer, silicon patterns formed on tops of the semiconductor poles, respectively, first junction areas formed in the semiconductor substrate of trench bottoms, respectively, and second junction areas each formed in the silicon patterns.

The vertical transistor according to a first embodiment further may include an insulating layer formed over the semiconductor substrate, including spaces between the gate electrodes, and having grooves formed therein, the grooves exposing the semiconductor poles. The silicon patterns may be formed in the grooves.

The vertical transistor according to a second embodiment further may include a first insulating layer formed in spaces between the gate electrodes, wherein the first insulating layer has the same height as that of the semiconductor poles.

In the second embodiment, the top surface of the gate electrodes may be lower than that of the semiconductor poles. The vertical transistor according to the second embodiment further may include a second insulating layer formed on a top surface of the gate electrodes. The second insulating layer insulates the gate electrodes and the silicon patterns.

A width of the silicon pattern may be identical to or narrower than that of the semiconductor pole.

A method of forming a vertical transistor of a semiconductor device according to a first embodiment of the present invention may include forming semiconductor poles by etching a semiconductor substrate, which may include at the same time forming trenches near the semiconductor poles, forming a gate insulating layer and a conductive layer on a surface of the semiconductor substrate, including the semiconductor poles, forming gate electrodes on circumferences of the semiconductor poles by etching the conductive layer, forming an insulating layer over the semiconductor substrate, including spaces between the gate electrodes, forming grooves through which the semiconductor poles are exposed, in the insulating layer, and forming silicon patterns, each connected to the semiconductor poles, in the grooves, respectively.

The formation of the grooves through which the semiconductor poles are exposed in the insulating layer may include forming photoresist patterns on the insulating layer and etching the insulating layer exposed between the photoresist patterns.

A width of the groove may be identical to or narrower than the semiconductor pole.

A method of forming a vertical transistor of a semiconductor device according to a second embodiment of the present invention may include forming semiconductor poles by etching a semiconductor substrate and at the same time forming trenches near the semiconductor poles, forming a gate insulating layer and a conductive layer on a surface of the semiconductor substrate including the semiconductor poles, forming gate electrodes on circumferences of the semiconductor poles by etching the conductive layer, forming a first insulating layer in spaces between the gate electrodes, and forming silicon patterns on tops of the semiconductor poles.

The formation of the first insulating layer in the spaces between the gate electrodes may include forming the first insulating layer in the semiconductor substrate including the spaces between the gate electrodes, and polishing the first insulating layer in such a way as to expose the semiconductor poles.

Before the silicon patterns are formed on the tops of the semiconductor poles, the gate electrodes may be etched such that a surface of the gate electrodes is lower than a surface of the semiconductor poles and a surface of the first insulating layer, and a second insulating layer is formed on the gate electrodes.

The gate electrodes may include metal, and the etching of the gate electrodes may be performed using wet etch.

In the first and second embodiments, before the gate insulating layer is formed, first junction areas may be formed in the semiconductor substrate of trench bottoms.

In the first and second embodiments, the first junction areas may be using a pad oxide layer for hindering implantation of impurity formed on a surface of the semiconductor poles.

In the first embodiment, before the insulating layer is formed, first junction areas may be formed in the semiconductor substrate of trench bottoms.

In the second embodiment, before the first insulating layer is formed, first junction areas may be formed in the semiconductor substrate of trench bottoms.

In the first and second embodiments, after the silicon patterns are formed, second junction areas may be formed in the silicon patterns.

In the first and second embodiments, the formation of the silicon patterns may be performed using a selective epitaxial growth (SEG) method.

In the first and second embodiments, a width of the silicon pattern may be identical to or narrower than that of the semiconductor pole.

DESCRIPTION OF SPECIFIC EMBODIMENTS

Figure 1:
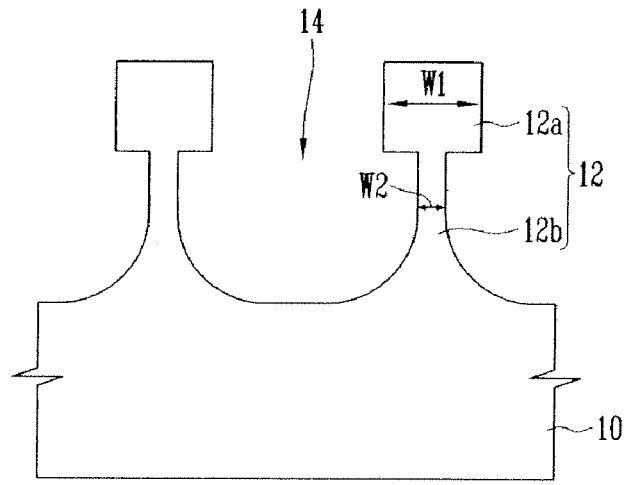
FIG. 1 is a diagram showing conventional semiconductor poles.
Figure 2:
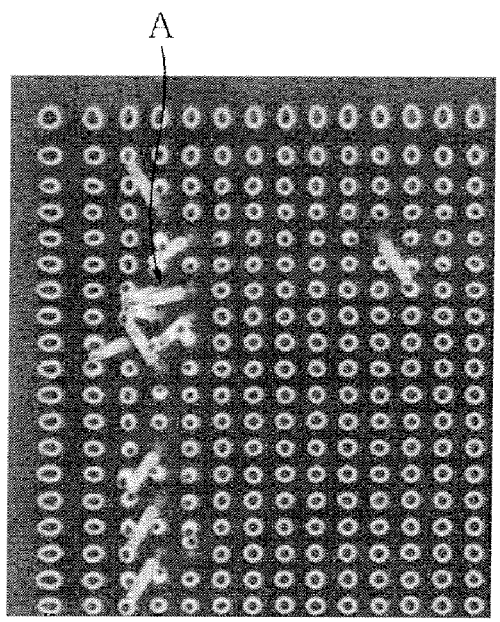
FIG. 2 is a diagram showing problems occurring in a method of forming conventional semiconductor poles.

Hereinafter, the present invention will be described in detail in connection with specific embodiments with reference to the accompanying drawings. The present embodiments are provided to complete the disclosure of the present invention and to allow those having ordinary skill in the art to understand the scope of the present invention. When it is said that any part, such as a layer, film, area, or plate, is positioned on another part, it means the part is directly on the other part or above the other part with at least one intermediate part. To clarify multiple layers and regions, the thickness of the layers are not to scale and may be enlarged in the drawings.

FIGS. 3A to 3G are sectional views showing, step-by-step, a method of forming a vertical transistor in accordance with a first embodiment of the present invention.

Figure 3A:
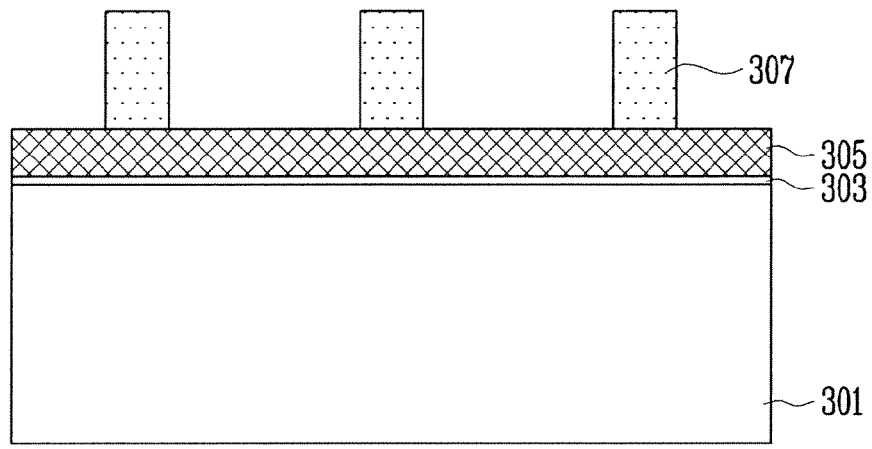
FIGS. 3A to 3G are sectional views showing, step-by-step, a method of forming a vertical transistor in accordance with a first embodiment of the present invention.

Referring to FIG. 3A, after a hard mask layer 305 is formed over a semiconductor substrate 301, first photoresist patterns 307 are formed on the hard mask layer 305. The first photoresist patterns 307 are formed to define areas where semiconductor poles will be formed. The hard mask layer 305 includes nitride materials. Before the hard mask layer 305 is formed, a pad oxide layer 303 for preventing damage to the semiconductor substrate 301 when a subsequent process is performed may be further formed on the semiconductor substrate 301.

Figure 3B:
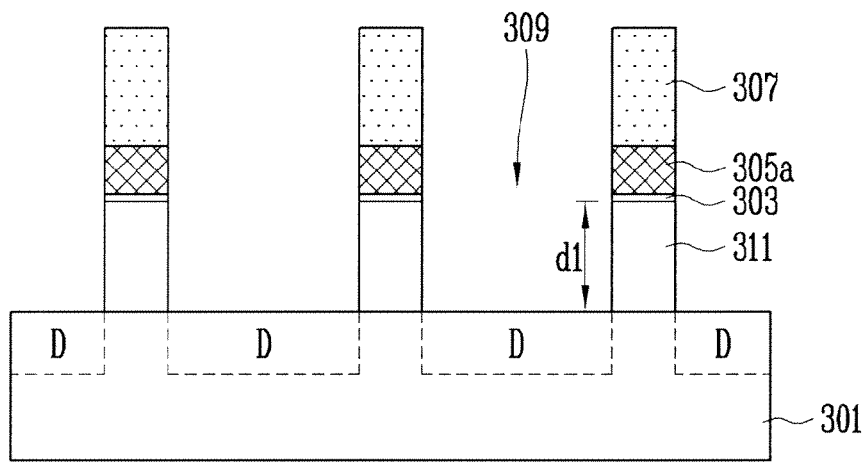

Referring to FIG. 3B, the hard mask layer 305 exposed between the first photoresist patterns 307 is etched, thus forming hard mask patterns 305a. The pad oxide layer 303 and the semiconductor substrate 301 exposed between the hard mask patterns 305a are etched. Accordingly, first trenches 309, and semiconductor poles 311 are separated from each other by the intervening first trenches 309 formed in the semiconductor substrate 301. A horizontal section of the semiconductor pole 311 may have a variety of forms such as a square or a circle. In this case, a depth 'd1' of the first trenches 309 determines the height of the semiconductor poles 311 corresponding to a channel length of a semiconductor device. Therefore, the depth 'd1' can be set variously according to the characteristics of semiconductor devices. At this time, first junction areas D can be formed by implanting ions into the semiconductor substrate 301 exposed between the first photoresist patterns 307 using the first photoresist patterns 307 as a mask.

Figure 3C:
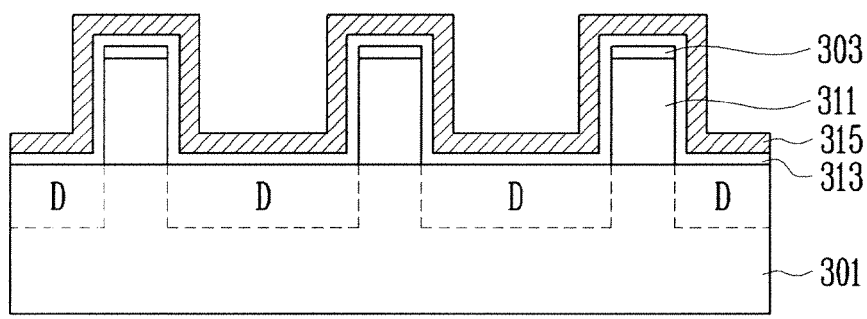

Referring to FIG. 3C, after the first photoresist patterns and the hard mask patterns are removed, a gate insulating layer 313 and a conductive layer 315 are formed on the entire surface of the semiconductor substrate 301, including the semiconductor poles 311 and the pad oxide layer 303. The gate insulating layer 313 includes an oxide layer, and the conductive layer 315 includes at least one of metal, such as tungsten (W), and polysilicon.

Figure 3D:
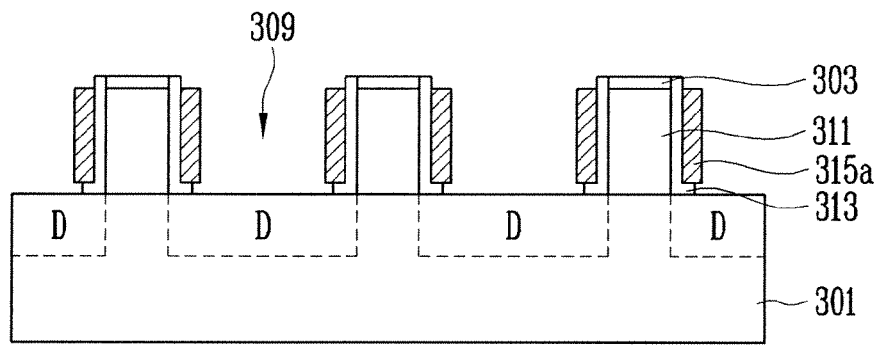
Figure 3E:
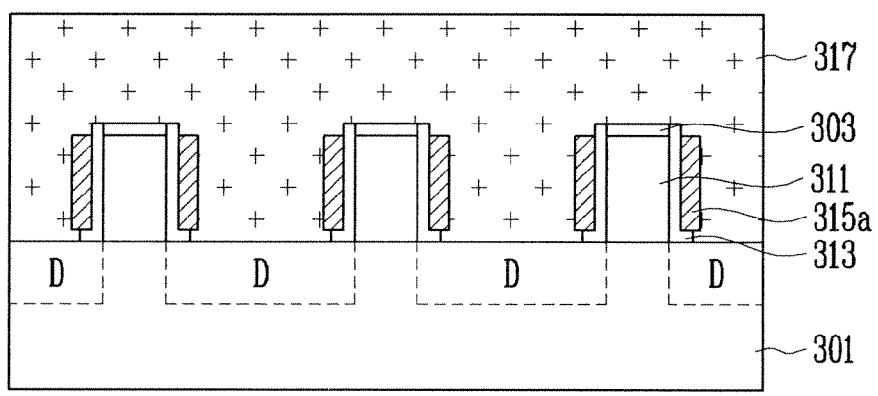

Referring to FIG. 3D, the tops of the semiconductor poles 311 and the conductive layer 315 at the bottom of the first trenches 309 are removed so that the conductive layer 315 remains on the circumferences of the semiconductor poles 311, thus forming gate electrodes 315a on the sidewalls of the semiconductor poles 311. The conductive layer 315 is removed by a blanket etch process. The first junction areas D described above with reference to FIG. 3B can be formed after the gate electrodes 315a are formed. That is, if impurity is implanted through an ion implantation process using the remaining pad oxide layer 303 and the gate electrodes 315a as an ion implantation mask, the impurity is implanted into the bottom of the first trenches 309 between the gate electrodes 315a, thus forming the first junction areas D. However, at this time, it is preferred that impurity not be implanted into the semiconductor poles 311 since the pad oxide layer 303 hinders such ion implantation, and even if the impurity is implanted into the semiconductor poles 311, the amount of the implanted impurity is minimal Referring to FIG. 3E, an insulating layer 317 is formed on the entire surface of the semiconductor substrate 301, including the gate electrodes 315a, the gate insulating layer 313, the pad oxide layer 303, and the semiconductor poles 311, such that the space between the gate electrodes 315a is gap-filled. The insulating layer 317 is formed to prevent the interconnection of silicon patterns in a subsequent process of forming the silicon patterns and can be formed from an oxide layer. This is described in detail later on with reference to FIG. 3G.

Figure 3F:
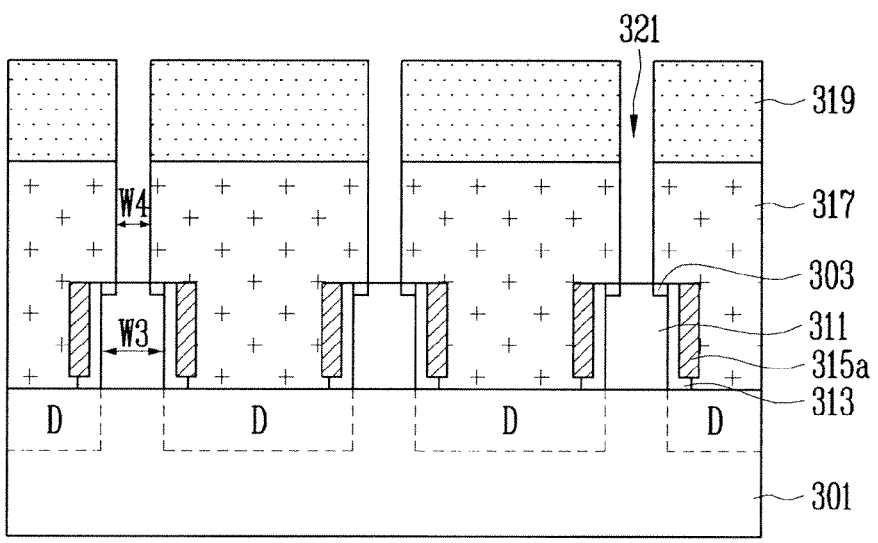

Referring to FIG. 3F, second photoresist patterns 319 are formed on the insulating layer 317. The insulating layer 317 exposed between the second photoresist patterns 319 is etched, thus forming grooves 321. At this time, the pad oxide layer 303 is etched. The groove 317 can have a variety of forms, such as a square or a circle, and can have the same shape as that of the semiconductor poles 311. Further, a width W4 of the groove 321 determines the width of a silicon pattern formed in a subsequent process. Thus, in order for the silicon pattern and the gate electrode 315a from being insulated from each other, the width of the silicon pattern has to be identical to or narrower than a width W3 of the semiconductor pole 311. Accordingly, the width W4 of the groove 321 may be preferably identical to or narrower than the width W3 of the semiconductor pole 311.

Figure 3G:
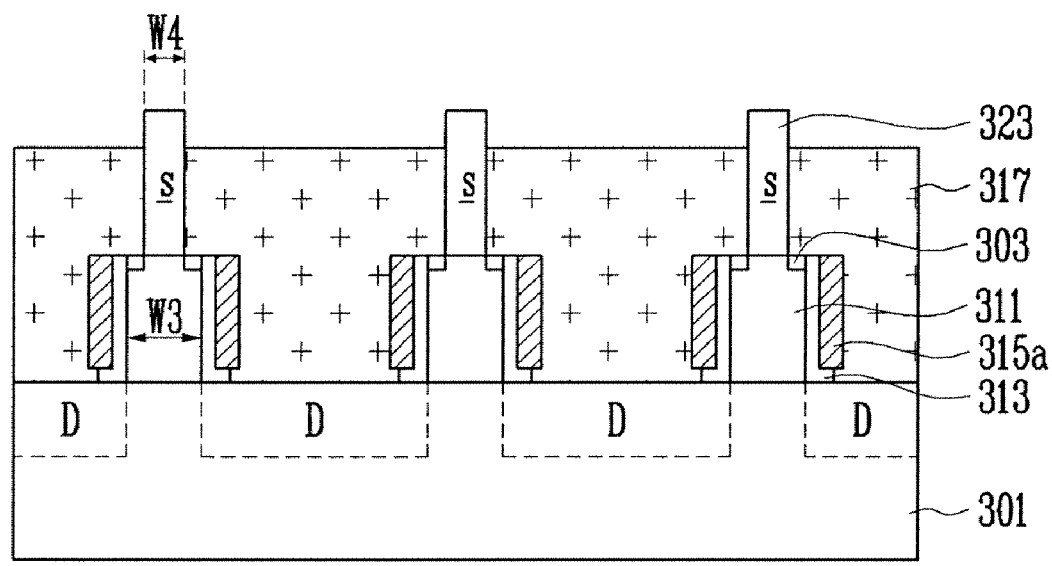

Referring to FIG. 3G, silicon patterns 323, each connected to the semiconductor poles 311, are formed within the grooves 321, respectively. At this time, the width W4 of the silicon pattern 323 is identical to the width W4 of the groove 321. The silicon patterns 323 can be formed by growing silicon single crystals using a selective epitaxial growth (hereinafter referred to as "SEG") method such that the silicon patterns 323 are respectively connected to the semiconductor poles 311 exposed through the grooves 321. The silicon single crystals grown by the SEG method are not grown on the insulating layer 317, including an oxide layer, etc. and, therefore, the silicon patterns 323 are prevented from being connected to each other by the insulating layer 317. After the silicon patterns 323 are formed, second junction areas S can be formed by controlling ion implantation energy such that ions are implanted into only the silicon patterns 323. One of the first and second junction areas D, S becomes a source and the other of them becomes a drain. For example, the first junction areas D may become drains and the second junction areas S may become sources.

Next, second trenches where bit lines will be formed are formed by etching the insulating layer 317 exposed between the silicon patterns 323 and the semiconductor substrate 301. A subsequent process of forming bit lines electrically connected to the first junction areas D on the sides of the second trenches is then carried out.

As described above, in the first embodiment of the present invention, in the state in which the gate electrodes 31 Sa support the semiconductor poles 311 corresponding to the channel areas, subsequent processes, including the formation process of the silicon patterns 323 corresponding to the junction areas, are performed. Accordingly, although the height of the semiconductor pole 311 is formed high in order to form a channel having a long length, the semiconductor pole does not collapse or incline.

Further, in the first embodiment of the present invention, the bottom surface of the first trench 309 of the present invention can be formed flat as compared with a conventional trench, which was formed to have a round bottom surface, due to the characteristics in the manufacturing process. Accordingly, according to the present invention, in a process of forming second trenches by etching the semiconductor substrate 301 corresponding to the first trenches 309 and also forming bit lines on the sides of the second trenches, the inner surfaces of the second trenches can be formed flat and the bit lines formed on the sides of the second trenches can be formed uniformly.

Figure 4A:
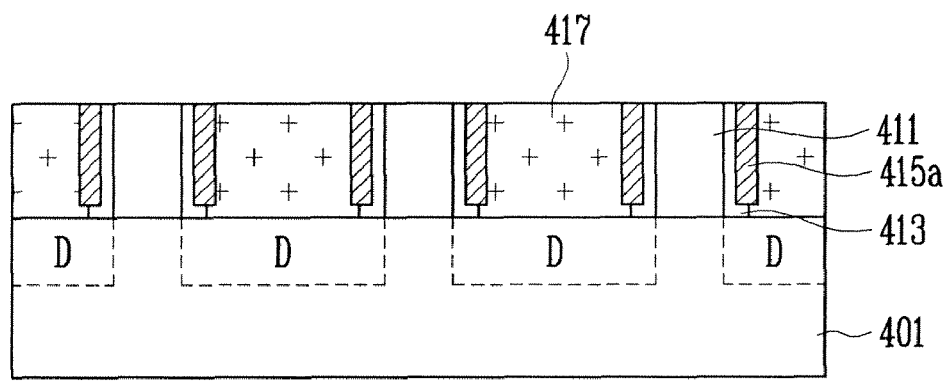
FIGS. 4A to 4C are sectional views showing a part of a method of forming a vertical transistor in accordance with a second embodiment of the present invention.
Figure 4B:
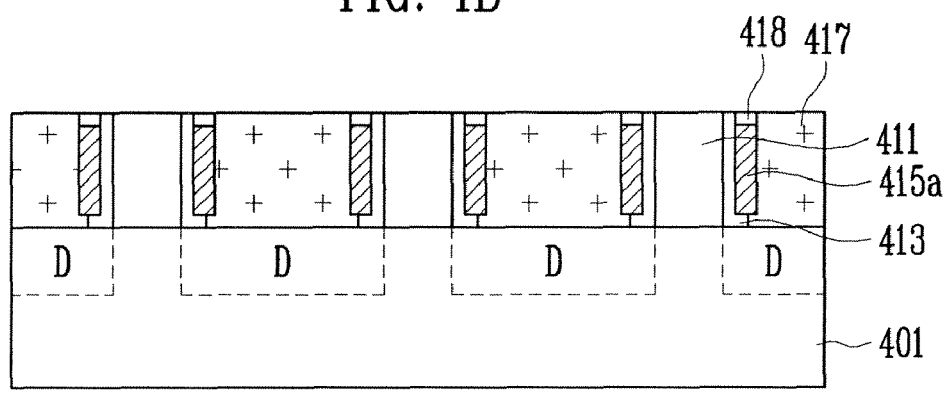

FIGS. 4A and 4B are sectional views showing a part of a method of forming a vertical transistor in accordance with a second embodiment of the present invention. The second embodiment of the present invention is almost identical to the first embodiment of the present invention except that a first insulating layer 417 and gate electrodes 415a are formed differently from those of the first embodiment of the present invention and a second insulating layer 418 is further formed on the gate electrodes 415a.

In a method of forming semiconductor poles in accordance with a second embodiment of the present invention, the same process as that described with reference to FIGS. 3A to 3E is first performed and a process shown in FIG. 4A is then performed.

Referring to FIG. 4A, the first insulating layer 417 is polished using a Chemical Mechanical Polishing (CMP) method in order to expose semiconductor poles 411 and gate electrodes 415a. Thus, the first insulating layer 417 leaves spaces between the gate electrodes 415a and has the same height as that of the semiconductor pole 411. At this time, a pad oxide layer is polished. In this case, the gate electrodes 415a can be electrically connected to silicon patterns that will be formed in a subsequent process. Accordingly, the second insulating layer 418 should be further formed only on the top of the exposed gate electrodes 415a.

Referring to FIG. 4B, the gate electrodes 415a are etched to have a top surface, which is lower than a top surface of the semiconductor poles 411. At this time, the gate electrodes 415a may preferably include metal such as tungsten (W). Metallic materials have a different etch selectivity for wet etch to the first insulating layer 417 and the semiconductor poles 411. Etch materials that rapidly etch metallic material as compared with the first insulating layer 417 and the semiconductor poles 411 can include a sulfuric acid and hydroperoxide mixture (SPM: $H_2SO_4+H_2O_2$) or the like. If a wet etch process is performed in the state in which the gate electrodes 415a and the semiconductor poles 411 are exposed using this SPM, etc., the top surface of the gate electrodes 415a becomes lower than that of the semiconductor poles 411, thus forming spaces defined by a gate insulating layer 413, the gate electrodes 415a, and the first insulating layer 417. The spaces defined by the gate insulating layer 413, the gate electrodes 415a, and the first insulating layer 417 are gap-filled with the second insulating layer 418.

Figure 4C:
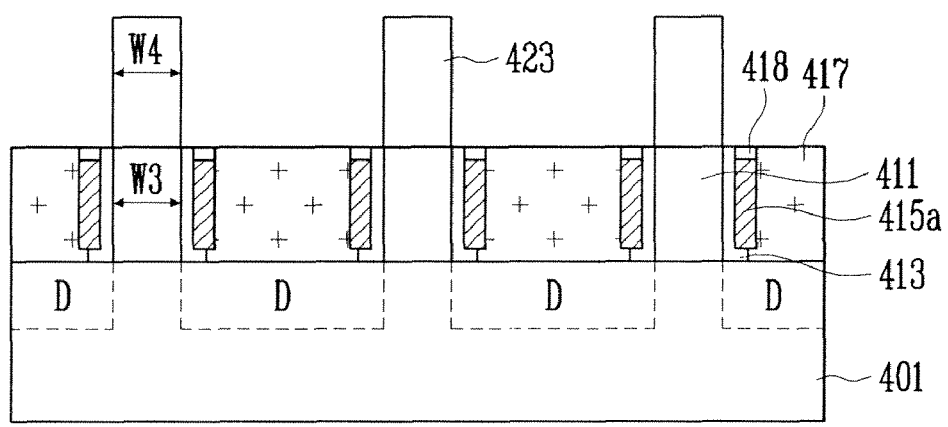

Referring to FIG. 4c, silicon patterns 423 connected to the semiconductor poles 411 are formed. The silicon patterns 423 can be formed by growing silicon single crystal using a SEG method so that the silicon patterns 423 are connected to the semiconductor poles 411. The silicon patterns 423 formed by the SEG method are insulated from the gate electrodes 415a by the second insulating layer 418. After the silicon patterns 423 are formed, second junction areas S can be formed by controlling ion implantation energy so that ions are implanted into only the silicon patterns 423. One of the first and second junction areas D, S becomes a source and the other of them becomes a drain. For example, the first junction areas D may become drains and the second junction areas S may become sources. Subsequent processes are identical to those described with reference to FIG. 3G.

As described above, in the second embodiment of the present invention, subsequent processes, including the process of forming the silicon patterns 423 corresponding to the junction areas, are performed in the state in which the gate electrodes 415a support the semiconductor poles 411 corresponding to the channel areas, like the first embodiment of the present invention. Accordingly, although the height of the semiconductor pole 411 is formed high in order to form a channel having a long length, the semiconductor pole 411 does not collapse or incline.

Further, in the second embodiment of the present invention, a bottom surface of the first trench 409 can be formed flat, like the first embodiment of the present invention. Accordingly, bit lines can be formed uniformly.

According to the present invention, after the semiconductor poles corresponding to the length of the semiconductor channels and the gate electrodes surrounding the sidewalls of the semiconductor poles are formed, subsequent processes of forming the silicon patterns corresponding to the junction areas, etc. are performed. Thus, the gate electrodes can support the semiconductor poles. Accordingly, the present invention can prevent a phenomenon in which, although the height of the semiconductor poles corresponding to the length of the channel increases, the semiconductor poles collapse or incline since the gate electrodes support the semiconductor poles. Consequently, the present invention can flexibly control the channel length in order to secure the characteristics of a semiconductor device and therefore enables developments of more stable semiconductor devices.

According to the present invention, when the conductive layer for forming the gate electrodes is formed, the trenches having almost vertical walls are gap-filled with the conductive layer. Accordingly, the present invention can prevent a seam from being formed within the trenches and therefore prevent the semiconductor substrate from being damaged by the scam when etching the conductive layer.

Further, according to the present invention, bottom surfaces of the trenches partitioning the semiconductor poles can be formed flat. Thus, when bit lines are formed by etching the semiconductor substrate corresponding to the bottom surfaces of the trenches in a subsequent process, areas where the bit lines will be formed are substantially uniform. Accordingly, the present invention can form the bit lines stably and uniformly and improve the reliability of measured data by the bit lines since the bit lines are uniform.

Moreover, according to the present invention, after the semiconductor poles corresponding to the channel length are formed, the silicon patterns corresponding to the junction areas are formed, so the process of implanting ions in order to form the junction areas can be performed step-by-step. Accordingly, the present invention can lower the difficulty of an ion implantation process.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A method of forming a vertical transistor of a semiconductor device, the method comprising:

forming semiconductor poles by etching a semiconductor substrate;

forming trenches near the semiconductor poles;

forming first junction areas in the semiconductor substrate under the trenches;

forming a gate insulating layer and a conductive layer on a surface of the semiconductor substrate, including the semiconductor poles;

forming gate electrodes on circumferences of the semiconductor poles by etching the conductive layer;

forming a first insulating layer in spaces between the gate electrodes;

etching the gate electrodes such that a surface of the gate electrodes becomes lower than a surface of the semiconductor poles and a surface of the first insulating layer;

forming a second insulating layer on the gate electrodes;

forming silicon patterns on tops of the semiconductor poles; and forming second junction areas in the silicon patterns.

2. The method of claim 1, wherein forming a first insulating layer in the spaces between the gate electrodes comprises:

forming the first insulating layer in the semiconductor substrate including the spaces between the gate electrodes; and exposing the semiconductor poles through the first insulating layer.

3. The method of claim 1, wherein:

the gate electrodes include metal, and the etching of the gate electrodes is wet etching.

4. The method of claim 1, wherein the first junction areas are formed using a pad oxide layer formed on a surface of the semiconductor poles for hindering implantation of impurity.

5. The method of claim 1, wherein forming silicon patterns is performed using a selective epitaxial growth method.

6. The method of claim 1, wherein a width of the silicon pattern is identical to or narrower than widths of the semiconductor poles.

* * * * *